United States Patent
Bierer

(10) Patent No.: US 7,109,699 B1
(45) Date of Patent: Sep. 19, 2006

(54) LONG RANGE ALTERNATING CURRENT PHASING VOLTMETER

(76) Inventor: Walter S. Bierer, 183 Elton Walker Rd., Blythewood, SC (US) 29016

( * ) Notice: Subject to any disclaimer, the term of this patent is extended or adjusted under 35 U.S.C. 154(b) by 0 days.

(21) Appl. No.: 11/131,644

(22) Filed: May 18, 2005

Related U.S. Application Data

(60) Provisional application No. 60/572,510, filed on May 19, 2004.

(51) Int. Cl.
G01R 19/00 (2006.01)
G01R 1/20 (2006.01)
G01R 15/20 (2006.01)

(52) U.S. Cl. ........................ 324/107; 324/126
(58) Field of Classification Search .................... None
See application file for complete search history.

(56) References Cited

U.S. PATENT DOCUMENTS

| | | | | |
|---|---|---|---|---|
| 3,392,334 A | * | 7/1968 | Bevins | 324/149 |
| 4,316,254 A | * | 2/1982 | Levin | 324/72.5 |
| 4,709,339 A | * | 11/1987 | Fernandes | 324/127 |
| 5,136,234 A | * | 8/1992 | Shaw | 324/72 |
| 5,270,660 A | * | 12/1993 | Werner et al. | 324/457 |
| 5,291,124 A | * | 3/1994 | Hoffman et al. | 324/72.5 |
| 6,272,329 B1 | | 8/2001 | Sawchuk | |
| 6,459,252 B1 | * | 10/2002 | Bierer | 324/72.5 |
| 6,617,840 B1 | * | 9/2003 | Bierer | 324/126 |
| 6,642,700 B1 | | 11/2003 | Slade et al. | |
| 6,734,658 B1 | * | 5/2004 | Bierer | 324/115 |
| 2002/0135353 A1 | * | 9/2002 | Bierer | 324/103 P |

FOREIGN PATENT DOCUMENTS

JP 06003374 A * 1/1994

OTHER PUBLICATIONS

Innovative Technologies for the Energy Industry from http://www.avistarinc.com/news/ dated May 2, 2005.
Accurate Phase Identification from http://www.avistarinc.com/news/ dated May 2, 2005.
Innovative Technologies for the Energy Industry (article entitled Avistar Introduces AP-10 Phase Identification System dated Apr. 2, 2004, (Author unknown) from http://www.avistarinc.com/news/PressRelease_040204.html dated May 2, 2005.
Innovative Technologies for the Energy Industry (article entitled THE AP-10 System: Accurate Phase Indentification . . . Anywhere from http://www.avistarinc.com/technologies/AboutPhase_AP10.html dated May 2, 2005.

* cited by examiner

*Primary Examiner*—Jermele Hollington
(74) *Attorney, Agent, or Firm*—Michael A. Mann; Nexsen Pruet, LLC

(57) ABSTRACT

A long-range wireless phasing voltmeter having a high impedance AC voltmeter in series between two high impedance probes. Shielding surrounds and electrically isolates the voltmeter and probes that communicate wirelessly via a pair of frequency translators, thus eliminating the cable customarily used to connect the probes and enabling measurements of the voltages, voltage differences, phases and phase difference between two conductor that may be miles apart. The signal transmitted from the first probe to the second may be analog or digital and is automatically compensated to correct the synchronization of the transmitted signal for the delay required to send it via the two translators.

11 Claims, 3 Drawing Sheets

LONG RANGE ALTERNATING CURRENT PHASING VOLTMETER

PRIORITY CLAIM

Applicant claims priority to U.S. Provisional Application Ser. No. 60/572,510 filed May 19, 2004, which is incorporated herein by reference.

STATEMENT REGARDING FEDERALLY SPONSORED RESEARCH OR DEVELOPMENT

Not applicable.

REFERENCE TO A SEQUENCE LISTING, A TABLE, OR A COMPUTER PROGRAM LISTING COMPACT DISK APPENDIX

Not Applicable.

BACKGROUND OF THE INVENTION

The present invention relates to voltmeters generally and to voltmeters for use in electrical power transmission line servicing and maintenance in particular.

Electricity transmitted through power lines destined for commercial, industrial and residential use can involve hundreds of thousands of volts and high currents. Inevitably, there is an element of danger in measuring the voltage on a transmission line because of the need to make contact with the line. Indeed, even the proximity to a high voltage line may be sufficient to cause a spark to jump through the air to the nearest object. Nonetheless, in installing, servicing and repairing power lines, there are various occasions when contact is made, such as when the voltage carried by a line must be measured.

Presently, high voltage phasing voltmeters use two test probes, which are each high voltage resistors housed in an insulated holder. The probes are electrically connected in series with a meter using a cable to connect them. The holders will have metal hooks or other fittings on their ends to facilitate a quick, good electrical contact with transmission lines. Often the meter is mounted to one of the two test probes and oriented so that the electric utility worker can read the voltage displayed on the meter. "Hot sticks" may be used to hold and elevate the entire assembly up to a transmission line. The meter may be designed to measure either voltage or current, but its display indicates voltage.

In addition to concerns for safety, there are a number of factors that introduce inaccuracies in these types of measurements. One of these factors is the existence of capacitive currents. However, the inaccuracies in phasing voltmeters attributable to capacitive currents are eliminated by the design disclosed and described in a commonly owned U.S. Pat. No. 6,459,252 issued Oct. 1, 2002, which is incorporated herein by reference.

Other factors that affect accuracy with phasing voltmeters have also been solved. On occasion, more than a few feet may separate power transmission lines. While the alternating current phasing voltmeter disclosed in the related U.S. Pat. No. 6,459,252, practically eliminates capacitive currents regardless of the length of the cable required to make measurements of power lines that are separated, it does not effectively address the problem of the physical problems in dealing with a long cable or the problem of having a cable that is not long enough. Commonly owned U.S. Pat. No. 6,617,840 issued Sep. 9, 2003 and U.S. Pat. No. 6,734,658, issued May 11, 2004, however, solve this problem to some extent by eliminating the cable altogether in favor of an alternating current phasing voltmeter in a master and slave probe combination that communicate voltage information wirelessly. The patent specification of U.S. Pat. No. 6,734,658 is also incorporated herein by reference. This phasing voltmeter also helps to overcome the natural reluctance of workers to apply test probes to power lines carrying very high voltages and it incorporates the accuracy improvements of U.S. Pat. No. 6,459,252.

However, there remains a need for a phasing voltmeter that is accurate, easy to read, and can be easily used when the transmission lines are separated by more than a few hundred feet, perhaps even separated by a distance on the order of a few miles.

SUMMARY OF THE INVENTION

According to its major aspects and briefly recited, the present invention is a wireless phasing voltmeter system in which two intelligent, full-duplex translators enable the transmission of voltage measurement information and comparison of voltages measured by two wireless probes that are several miles apart. The system adjusts the voltage measurement information to compensate for the delays in transmission of the signal from one probe to the other. The phasing voltmeter system, in its preferred embodiment, includes the two probes with associated signal processing electronics, two transceivers, two full duplex translators with internal microprocessors, and a high impedance alternating current (AC) voltage processor with display. The phasing voltmeter system determines the voltages, the voltage difference between measured power lines, the phases and the phase differences.

The voltage signal obtained by one of the probes, which includes both instantaneous voltage and phase information, is transmitted using multiple carrier frequencies, one frequency between the first test probes and the first intelligent frequency translator, and two more carrier frequencies between the first and second frequency translators. All three of the carrier frequencies are preferably radio frequency carrier frequencies. The signal from the first or "slave" probe is transmitted to the first intelligent frequency translator by the first transceiver, then forwarded to the second intelligent frequency translator, and finally to the second transceiver where it is compared to the signal from the second or "master" probe by its master processor. The comparison of the signals by the processor allows the display of the voltages of the two power lines, the voltage difference, the phase of each and the phase difference.

An important feature of the present invention is the use of intelligent frequency translators. Both translators have on board microprocessors, hence the designation "intelligent" translators. In addition to allowing the signal to be transmitted over a distance on the order of several miles, the intelligent frequency translator automatically adjusts the voltage signal information to compensate for the delay in transmission, regardless of distance, so that the displayed information is as accurate as if the probes were close together.

An important feature of the present phasing voltmeter system is the use of multiple carrier frequencies to transmit the voltage signal information from the first test probe to a processor in the second probe potentially miles away. Such an arrangement—and using a full duplex intelligent frequency translator to receive a signal on a first frequency carrier and retransmit it while receiving a synchronizing return pulse on a frequency carrier pair in particular—permits measurements over extended distances quickly and accurately. Although full duplex frequency translators themselves are well known in general, they are believed to be unknown in voltmeters.

Another important feature of the present invention is the use of radio frequency carriers to transmit the signal from one of the high impedance probes to the voltmeter. Radio transmission eliminates the need for a cable between the probes, which is completely impractical when power lines, and thus the probes, are separated by more than a very few hundred feet. Although any electromagnetic carrier frequency (visible, infra-red, radio-frequencies, microwave, for example) can be used, radio frequencies are preferred because they are not restricted to line of sight transmissions. Preferably the signals are transmitted on the carriers digitally and in such a way, as will be described in more detail herein, so as to minimize the effects of electrical noise on the transmission, such as for example by frequency shift keying.

Another feature of the present invention is the use of a low frequency for obtaining and transmitting digital data (as opposed to the carrier frequencies) from the probes. The low frequency improves the signal to noise ratio because the data can be sampled by the translators often enough to verify each bit.

These and other features and their advantages will be apparent to those skilled in the art of transmission line voltage measurement from a careful reading of the Detailed Description of Preferred Embodiments accompanied by the following drawings.

BRIEF DESCRIPTION OF THE SEVERAL VIEWS OF THE DRAWINGS

In the figures.

DETAILED DESCRIPTION OF THE INVENTION

The present invention is a phasing voltmeter system that is an improvement over existing phasing voltmeters. The improvement lies in its ability to make accurate measurements of voltage information extracted from power lines that may be separated by a distance of several miles, extends the range of the master/slave probes described in U.S. Pat. No. 6,734,658, when desired.

Figure 1:
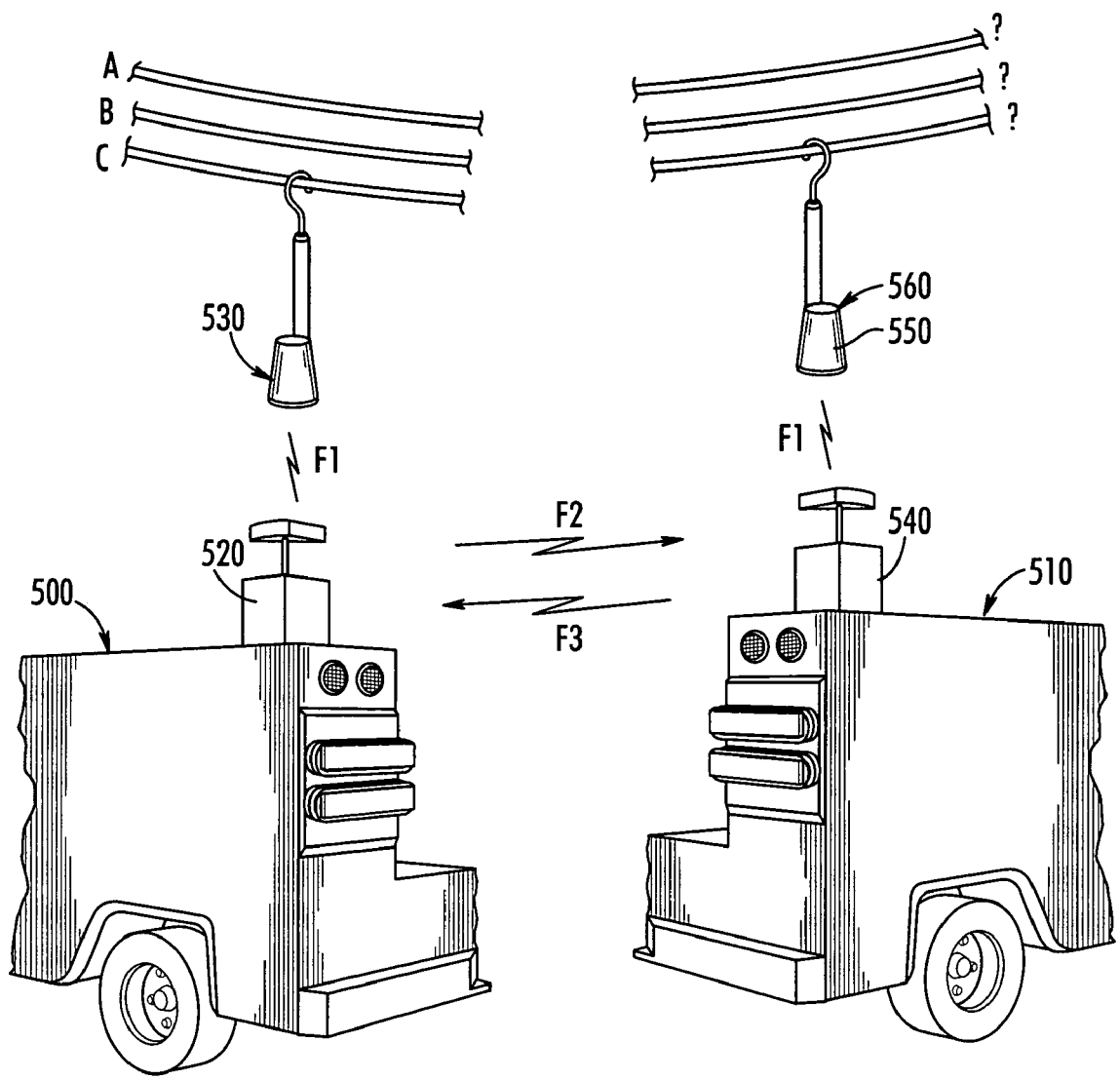
FIG. 1 illustrates the retransmission of the signal from the probe to the meter through a translating transmitter and receiver set using a different frequency carrier and greater power.
Figure 2:
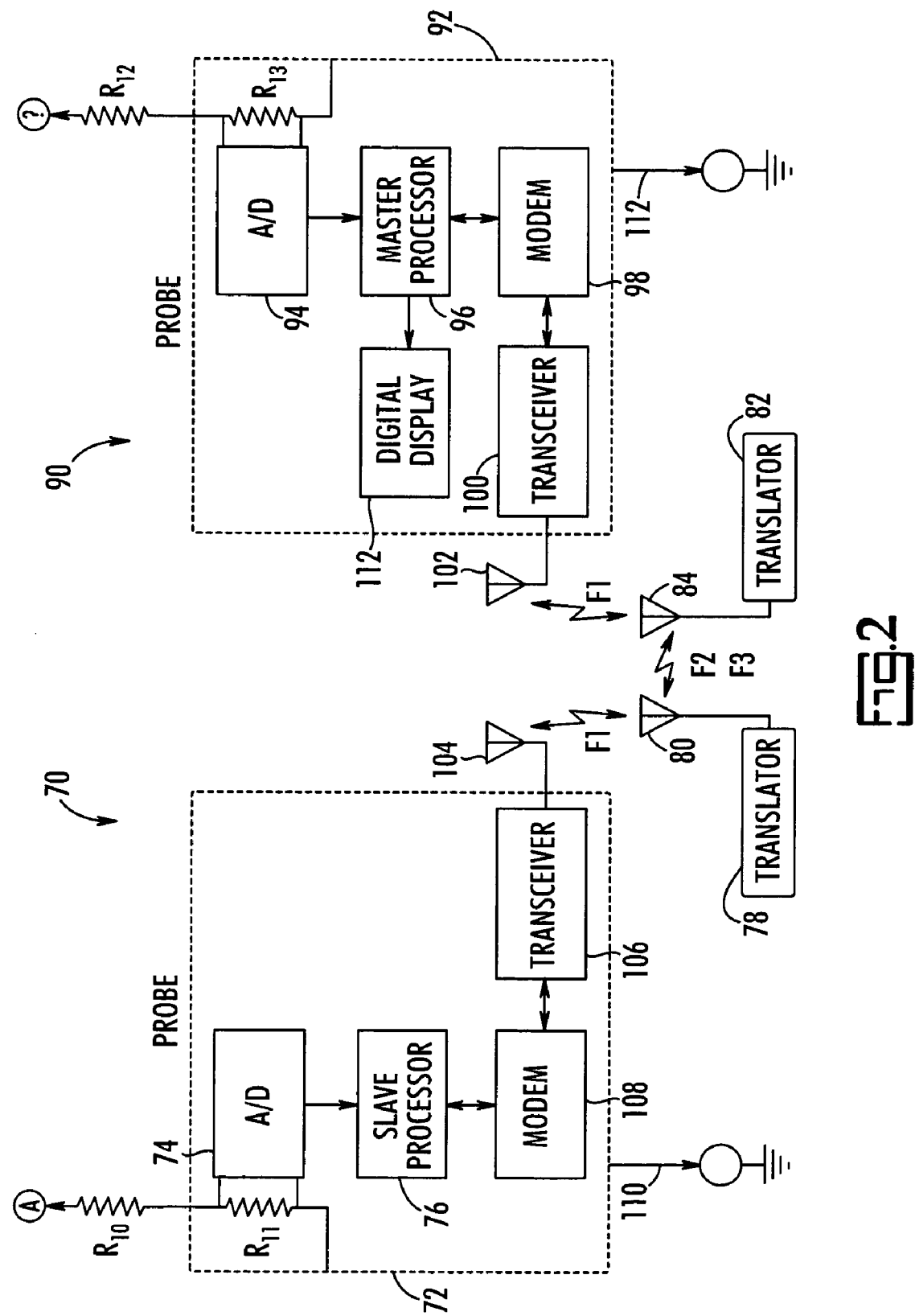
FIG. 2 illustrates an embodiment of the wireless phasing voltmeter, according to an alternative preferred embodiment of the present invention.
Figure 3:
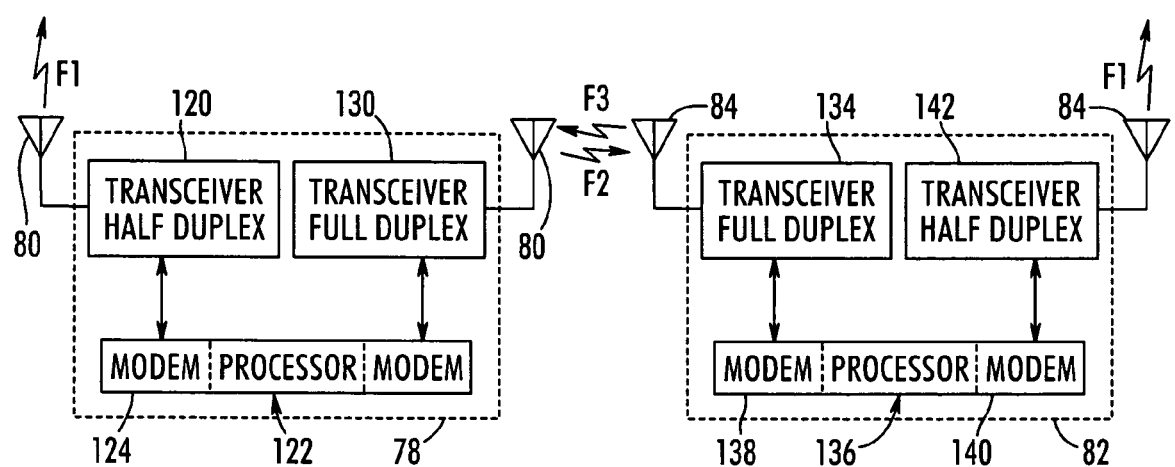
FIG. 3 illustrates the components of the two translators, according to a preferred embodiment of the present invention.

Referring now to FIGS. 1–3, there is illustrated a first electric utility vehicle 500 and a second electric utility vehicle 510 spaced a distance apart, such as a distance of several miles. First and second electric utility vehicles are each parked near transmission lines. First vehicle 500 is under lines A, B and C. The phases of the power lines near second vehicle 510 are unknown.

First vehicle 500 has a first intelligent frequency translator 520 in radio communication on a first carrier frequency with a first test probe 530 and in radio communication in full duplex on a second and third carrier frequency with a second intelligent frequency translator 540 that is in turn in radio communication on the first carrier frequency with a processor 550 inside a second test probe 560. The signal from test probe 530 is transmitted on the first frequency carrier to first frequency translator 520. First frequency translator 520 translates the signal it receives from the first frequency carrier to the second frequency carrier and forwards the translated signal to second frequency translator 540 using a second and third carrier frequency. Second intelligent frequency translator 540 translates the signal from the second frequency carrier to the first frequency carrier and transmits it to processor 550 where it is processed along with a second signal from second test probe 560.

Prior to sending the voltage signal information to second intelligent frequency translator, first frequency translator automatically determines the length of the delay in the signal that is due to the transmission time, as will be explained below in more detail. The length of the transmission time is used by first frequency frequency ranslator 540 to advance the signal's transmission so that, when it arrives, it will be synchronized with the signal from the first probe as if the two were located in the same instrument.

Frequency translators are well known. See, for example, the description in U.S. Pat. No. 6,272,329, incorporated herein by reference, and frequency translator products sold by a number of suppliers including Conner Winfield, Raltron Electronics Corporation and Vectron International. Transceivers, which are devices capable of transmitting and of receiving, are also known. In the present specification, although the term transceiver will be used, it is intended that using two separate components, one to transmit and one to receive, are equivalent of one transceiver and, if two separate components are used, together they are a transceiver. Also, in the present description, transmissions in only one direction may be described but in practice certain "check back" information for confirming receipt or synchonization may be transmitted in the opposite direction. Therefore, transceiver may be used when a transmitter or a receiver may be sufficient if the check back information is handled in a different way. In this event, transceiver is also equivalent to either a transmitter or a receiver.

FIG. 2, illustrates schematically a circuit diagram of an embodiment of the present invention being used to measure the voltage differences between conductors A and an unknown phase of an energized, three-phase transmission line having conductors A, B and C.

In the present invention, illustrated in FIG. 2, a first probe 70, namely, the slave probe, is used to detect voltage from conductor A of a three phase power transmission system having conductors A, B, and C. As before, a high impedance resistor R10 is used to drop the voltage. A second, preferably adjustable, resistor R11 drops the voltage still further and is tied electrically to a grounded shield 72 on first probe 70. The ratio of the resistances of R10 to R11 is preferably approximately 1,000,000 to one. In a 100,000-volt power line, the voltage across R11 would be 0.1 volts. The voltage across R11 is converted from an analog signal to a digital signal by analog-to-digital converter 74 and fed to slave processor 76 as a voltage information signal. Slave processor 76 manages the flow of digital data between two components, namely, A/D converter 74 and a modem 108, described below, and processes the voltage information signal from these two sources and forwards them to a transceiver 106 via modem 108 on a first frequency carrier.

A first intelligent frequency translator 78 with an antenna 80 receives voltage information signals from slave processor 76 on first frequency carrier. A second intelligent frequency translator 82 and another antenna 84 are located remotely from first intelligent frequency translator 78. First frequency translator 78 can transmit to and receive signals from second frequency translator 82 in full duplex on two different frequency carriers, a first frequency carrier for transmitting by intelligent frequency translator 78 and a second frequency carrier for receiving. First and second intelligent frequency translators 78, 82, and their respective antennae 80, 84, may be miles apart, potentially to the limits of the signal frequency with due allowances for terrain and intervening structures.

A second probe 90, the master probe, spaced potentially miles apart from first probe 70, detects the voltage carried by C and drops that voltage significantly across R12, a high impedance resistor. The voltage is dropped further across resistor R13, which is tied electrically to a grounded shield 92. As in first probe 70, the ratio of the resistance of R12 to R13 is preferably approximately 1,000,000 to one. An analog-to-digital (A/D) converter 94 converts the analog voltage drop across R13 to a digital voltage signal and passes it to a master processor 96. The digitized voltage signal information from second probe 90 will be compared to that of first probe 70 once received. The carrier frequencies of first and second probes 70, 90, may be different but, when the power lines are close enough, probes 70 and 90 can communicate directly if they operate on the same, i.e, first, frequency carrier. The digitized voltage signal information may be transmitted by frequency modulation, amplitude modulation, phase modulation, or by frequency shift keying, the last of these being preferred, but all of which are well known techniques for transmitting digital signals.

The signal detected by antenna 80 of first frequency translator 82 is forwarded by first frequency translator 78 and antenna 80 to second frequency translator 82 via antenna 84, and then to master processor 96 via transceiver 100 and modem 98, which receives and demodulates the voltage signal information before forwarding it to master processor 96. The signals from probes 70 and 90 are processed by master processor 96 to compare voltage signal information. The compared voltage information signals may be converted to analog signals by a digital-to-analog (D/A) converter (not shown) for analog display on a display 112 or left in digital form for display Slave processor obtains two pieces of information from the measurement by probe 70 of the voltage of power line A. It obtains the instantaneous voltage with respect to ground and can extract from that data the zero crossing time which marks the beginning of a cycle and thus marks phase of the electrical power on the line. The zero crossing time occurs as the voltage moves from negative to positive. Phase information can be extracted by synchronizing the phase information between the voltage measurements of the two power lines.

Because the distance separating the two probes and the two intelligent frequency translators of the present invention, significant delays will likely be introduced in the receipt of the voltage and phase information received from first probe 70 that make synchronizing the phase information more important and more difficult. In order to compensate for this delay in the synchronization process, it is especially important to determine for each measurement the amount of delay being incurred, and then to adjust the one of the two signals accordingly.

In the present invention, the voltage information is digitized at a low frequency, namely 60 Hz, using pulse width modulation. The bits of information each begin on the zero crossing point but their duration varies depending on their representation of the two digital values. Preferably, one bit value is set at one third of a cycle and the other bit value is set at two thirds of a cycle. The voltage is thus represented digitally in a byte comprising a set of eight pulses of widths of one-third or two-thirds to represent, for example, 0s and 1s, respectively. This digital signal is imposed on first carrier frequency, preferably by frequency shift keying, and is then transmitted by first transceiver 106 to first intelligent frequency translator 78.

The components of first intelligent frequency translator 78 and second intelligent frequency translator 82 are shown in FIG. 3. For simplicity, the antennas of both are split in this figure and shown as two separate antennas but one antenna for each translator is all that is required with the use of radio frequency combiners. First intelligent frequency translator 78 includes a half duplex receiver 120 that receives the digitized signal from first transceiver 106 via antenna 80 and forwards it to processor 122. Processor 122 contains a first modem 124 and a second modem 126. First modem 124 demodulates the digital signal from first carrier frequency (or alternatively, processor 122 may be programmed to extract the digital voltage signal information from first carrier frequency directly). Second modem received the now demodulated voltage signal information from processor 122 and modulates the second carrier frequency with the voltage signal information for transmission via a full duplex transceiver 130 through antenna 80. The signal, when sent from full duplex transceiver 130 is sent more rapidly than when sent to half duplex receiver 120, preferably in quick bursts and preferably using frequency shift keying to improve the quality of the signal.

Before transmitting the digital voltage signal information on the second carrier frequency, a synchronizing pulse is sent to second intelligent frequency translator 82. This pulse is synchronized to the start of the alternating current cycle from power line A as detected by first probe 70, prepares second intelligent frequency translator 82 for receiving the digital voltage signal information, and precipitates a synchronizing return pulse from second intelligent frequency translator 82 as soon as the latter receives the initial synchronizing pulse. The time between these two pulses is used by processor 122 to determine the round trip delay time that occurs when sending a signal through full duplex transceiver 130 to second intelligent frequency translator 82 at whatever distance away it is located. Half of that time is the one-way delay or the transmission delay. The timing of the transmission of the digitized voltage signal from first intelligent frequency translator 78 to second intelligent frequency translator 82 is advanced by the transmission delay time, as determined by processor 122, thereby compensating fully for the delay time so that, when the digitized voltage signal information is received by second intelligent frequency translator 82, the digital voltage information is fully synchronized with, and can be properly compared to, the voltage information provided by second probe 90. Thus, not only can the instantaneous voltages be compared but also the difference in the timing of the zero crossover points of the two signals can be compared to yield complete phase information.

The two signals can be compared and analyzed to determine the voltages of the two power lines, the voltage difference, the phase of each and the phase difference.

The components of second intelligent frequency translator 82 are similar to those of first intelligent frequency translator 78. The voltage signal information coming from antenna 80 of full duplex transceiver 130 is received by an antenna 84 of a full duplex transceiver 134. Full duplex transceiver 134 forwards the received voltage signal information to a processor 136 that, like processor 122, has two modems 138, 140. Modem 138 demodulates the second carrier frequency to extract the voltage signal information and forwards it to modem 140, which modulates the first carrier frequency with the voltage signal information and sends the modulated carrier to a half duplex transceiver 142 for transmitting via antenna 84 to probe 90.

Ground leads 110, 112 may be eliminated but with a loss in accuracy. With them, the present phasing voltmeter is accurate to ±1%; without them, the voltmeter is accurate only to ±10%.

It is also possible to use half duplex transceivers rather than full duplex particularly if the half duplex transceivers are of the instant on variety so that the transmission of signals is not unduly delayed.

The use of radio frequencies is convenient and makes it possible to transmit through or around obstacles that might hinder line-of-sight transmissions such as visible light, infrared and possibly microwave transmissions. However, these other forms of electromagnetic waves could also be used. Also, the use of frequency modulation is preferred because of its resistance to noise but amplitude modulation is also possible. Most importantly, the use of frequency translators allows the signals from the first to the second probes to be transmitted over much larger distances, such as miles.

It is intended that the scope of the present invention include all modifications that incorporate its principal design features, and that the scope and limitations of the present invention are to be determined by the scope of the appended claims and their equivalents. It also should be understood, therefore, that the inventive concepts herein described are interchangeable and/or they can be used together in still other permutations of the present invention, and that other modifications and substitutions will be apparent to those skilled in the art of phasing voltmeters and power line measurements from the foregoing description of the preferred embodiments without departing from the spirit or scope of the present invention.

What is claimed is:

1. A phasing voltmeter system, said device comprising:
    (1) first test probe adapted to detect a first voltage and to generate and transmit a first voltage signal related to said first voltage, said first signal being transmitted on a first carrier frequency;
    (2) a second test probe adapted to detect a second voltage and to generate a second voltage signal;
    (3) a first frequency translator in communication with said first test probe and adapted to receive said first voltage signal and to translate said first voltage signal from said first carrier frequency to a second carrier frequency, said first frequency translator further adapted to transmit said first voltage signal on said second carrier frequency;
    (4) a second frequency translator in communication with said first frequency translator and adapted to receive said first voltage signal and translate said first voltage signal from said second carrier frequency to said first carrier frequency and to transmit said first voltage signal to said second test probe, said second test probe being adapted to receive said first voltage signal;
    (5) said second test probe including
        a processor adapted to compare said first and said second voltage signals, and
        a display in communication with said processor for displaying information about said first and said second voltage signals.

2. The phasing voltmeter system as recited in claim 1, wherein said first frequency translator imposes a delay on said first voltage signal before transmitting said first voltage signal at said second frequency carrier to said second frequency translator.

3. The phasing voltmeter system as recited in claim 2, wherein said delay is related to the distance said first and said second frequency translators are separated.

4. The phasing voltmeter system as recited in claim 2, wherein said delay compensates for the time taken by said first and said second frequency translators to transmit said first voltage signal.

5. The phasing voltmeter system as recited in claim 1, wherein said processor is adapted to determine said first voltage, said second voltage, a difference between said first and said second voltages, and a difference in phases between said first and said second voltages.

6. The phasing voltmeter as recited in claim 1, wherein said second carrier frequency is a radio wave carrier frequency.

7. The phasing voltmeter as recited in claim 1, wherein said first test probe transmits said first voltage signal by a method selected from the group consisting of frequency shift keying, frequency modulation, phase modulation, and amplitude modulation.

8. The phasing voltmeter as recited in claim 1, wherein said first and said second voltage signals are digital voltage signals.

9. A method of measuring voltage signal information about two conductors separated by a distance, said method comprising the steps of:
    generating first voltage signal information related to a voltage carried by a first conductor;
    generating second voltage signal information related to a voltage carried by a second conductor, said second conductor spaced apart from said first conductor;
    transmitting said first voltage signal information to a processor;
    reading said second voltage signal information by said processor;
    compensating said first voltage signal information for the time to transmit said first voltage signal information to said processor; and
    comparing said first and said second voltage signals to obtain a difference in said first and said second voltages.

10. The method as recited in claim 9, wherein said compensating step further comprises the steps of
    determining a time to transmit said first voltage signal information; and
    advancing transmission of said first voltage signal information by said time to transmit before said transmitting step.

11. A method of measuring voltage signal information about two conductors separated by a distance, said method comprising the steps of:
    generating first voltage signal information related to a voltage carried by a first conductor;
    generating second voltage signal information related to a voltage carried by a second conductor spaced apart from said first conductor;
    transmitting said first voltage signal information to a first frequency translator;
    transmitting said first voltage signal information from said first frequency translator to a second frequency translator;
    transmitting said first voltage signal information from said second frequency translator to a processor; and
    comparing using said processor said first and said second voltage signal information to obtain a difference in said first and said second voltages.

* * * * *